(12) United States Patent
Xu et al.

(10) Patent No.: US 11,298,726 B2
(45) Date of Patent: Apr. 12, 2022

(54) CLEANER AND CLEANING DEVICE

(71) Applicants: BOE Technology Group Co., Ltd., Beijing (CN); Hefei Xinsheng Optoelectronics Technology Co., Ltd., Anhui (CN)

(72) Inventors: Min Xu, Beijing (CN); Pengfei Xu, Beijing (CN); Jiajia Shan, Beijing (CN); Kai Wu, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 942 days.

(21) Appl. No.: 16/064,930

(22) PCT Filed: Nov. 21, 2017

(86) PCT No.: PCT/CN2017/112112
§ 371 (c)(1),
(2) Date: Jun. 21, 2018

(87) PCT Pub. No.: WO2018/205547
PCT Pub. Date: Nov. 15, 2018

(65) Prior Publication Data
US 2021/0268551 A1    Sep. 2, 2021

(30) Foreign Application Priority Data
May 12, 2017 (CN) .......................... 201720536401.8

(51) Int. Cl.
*B08B 3/02* (2006.01)

(52) U.S. Cl.
CPC .................................... *B08B 3/02* (2013.01)

(58) Field of Classification Search
CPC ....................................................... B08B 3/02
USPC ....................................................... 134/198
See application file for complete search history.

(56) References Cited

FOREIGN PATENT DOCUMENTS

| CN | 201239673 Y | 5/2009 |
| CN | 203209215 U | 9/2013 |
| CN | 104438238 A | 3/2015 |
| CN | 205096152 U | 3/2016 |
| CN | 205253403 U | 5/2016 |
| CN | 205684389 U | 11/2016 |
| CN | 205762570 U | 12/2016 |
| EP | 0694344 A1 | 1/1996 |
| EP | 1857192 A2 | 11/2007 |

(Continued)

OTHER PUBLICATIONS

JPH10277511A—Machine translation (Year: 1998).*

(Continued)

*Primary Examiner* — Tinsae B Ayalew
(74) *Attorney, Agent, or Firm* — Banner & Witcoff, Ltd.

(57) ABSTRACT

A cleaner and a cleaning device are disclosed. The cleaner includes: a guide rail; a lifting lever, one end of which is disposed on the guide rail and capable of moving along the guide rail; a feed pipe, disposed inside the lifting lever; and a nozzle, disposed on an end portion of one end of the lifting lever away from the guide rail and communicated with the feed pipe. The lifting lever is configured to allow the nozzle to be away from or close to the guide rail.

19 Claims, 7 Drawing Sheets

(56) References Cited

FOREIGN PATENT DOCUMENTS

| JP | H0979797 A | 3/1997 |
|----|------------|--------|
| JP | 10277511 A | 10/1998 |

OTHER PUBLICATIONS

Feb. 26, 2018—(WO) International Search Report and Written Opinion Appn PCT/CN2017/112112 with English Translation.
Nov. 15, 2021 (EP) Extended European Search Report Appn 17898349.0.

* cited by examiner

CLEANER AND CLEANING DEVICE

CROSS REFERENCE TO RELATED APPLICATIONS

The application is a U.S. National Phase Entry of International Application No. PCT/CN2017/112112 filed on Nov. 21, 2017, designating the United States of America and claiming priority to Chinese Patent Application No. 201720536401.8, filed on May 12, 2017. The present application claims priority to and the benefit of the above-identified applications and the above-identified applications are incorporated by reference herein in their entirety.

TECHNICAL FIELD

At least one embodiment of the present disclosure relates to a cleaner and a cleaning device.

BACKGROUND in the manufacturing process of a color filter (CF) substrate of a liquid crystal display (LCD), the photolithography process must be performed for multiple times, and every photolithography process mainly includes the following steps: coating, exposure, development, etc. The effect of development is mainly to use a liquid medicine to wash away photoresist on unexposed portions of the substrate. Waste liquid obtained after cleaning contains a large amount of photoresist components. After production for a period of time, the photoresist washed away from the substrate will retain and accumulate in components of a developing chamber, resulting in the pollution of corresponding positions and affecting the quality of products in the severe condition.

After production for a period of time, the developing chamber must be cleaned. In order to satisfy the requirement on the development process, a developer is composed of a plurality of developing chambers, so the developing chambers required to be cleaned are numerous. Meanwhile, the developing chambers have complex structure and narrow space, so it is difficult for the personnel to perform cleaning operation; the operation time is long; more manpower is required; and the cleaning effect is poor.

SUMMARY

At least one embodiment of the present disclosure provides a cleaner and a cleaning device.

At least one embodiment of the present disclosure provides a cleaner, comprising: a guide rail; a lifting lever, one end of which is disposed on the guide rail and capable of moving along the guide rail; a feed pipe, disposed inside the lifting lever; and a nozzle, disposed on an end portion of one end of the lifting lever away from the guide rail and communicated with the feed pipe. The lifting lever is configured to allow the nozzle to be away from or close to the guide rail.

For example, in the cleaner provided by an embodiment of the present disclosure, the lifting lever includes a first lifting lever, a second lifting lever and a connecting piece connecting the first lifting lever and the second lifting lever; the nozzle is disposed on an end portion of the first lifting lever; the second lifting lever is disposed on the guide rail; and the first lifting lever can perform up-and-down movement relative to the second lifting lever.

For example, in the cleaner provided by an embodiment of the present disclosure, the connecting piece is configured to rotate to drive the first lifting lever to perform the up-and-down movement relative to the second lifting lever.

For example, the cleaner provided by an embodiment of the present disclosure further comprises: an inner spray head and an outer spray head; the inner spray head is disposed inside the outer spray head; the nozzle is disposed inside the inner spray head; a plurality of first spray holes are provided on the outer spray head; a plurality of second spray holes are provided on the inner spray head; and at least one of the inner spray head or the outer spray head is configured to rotate around the lifting lever.

For example, in the cleaner provided by an embodiment of the present disclosure, an arrangement pitch of the second spray holes on the inner spray head is different from an arrangement pitch of the first spray holes on the outer spray head.

For example, in the cleaner provided by an embodiment of the present disclosure, the inner spray head is provided with a protruded slider which is arranged around an outer surface of the inner spray head and perpendicular to an axial direction of the lifting lever; the outer spray head is provided with a recessed guide slot which is arranged around an inner surface of the outer spray head and perpendicular to the axial direction of the lifting lever; and the slider is embedded into the guide slot and configured to move relative to the guide slot.

For example, the cleaner provided by an embodiment of the present disclosure further comprises a multi-way valve disposed at one end of the lifting lever close to the guide rail; the multi-way valve is close to one end of the lifting lever and communicated with the feed pipe.

For example, the cleaner provided by an embodiment of the present disclosure further comprises a supporting rod connected with one end of the lifting lever close to the guide rail; the multi-way valve is connected with one end of the supporting rod away from the lifting lever.

For example, the cleaner provided by an embodiment of the present disclosure further comprises a laser ranging unit disposed on the guide rail.

For example, the cleaner provided by an embodiment of the present disclosure further comprises a supporting stand which is disposed on the guide rail and capable of moving along the guide rail; the guide rail includes a plurality of parallel sub-rails; and the lifting lever is supported on the supporting stand.

For example, the cleaner provided by an embodiment of the present disclosure further comprises a liquid guiding groove disposed between the sub-rails, wherein the liquid guiding groove is set to be inclined.

At least one embodiment of the present disclosure provides a cleaning device, comprising the cleaner according to any embodiment of the present disclosure.

For example, the cleaning device provided by an embodiment of the present disclosure further comprises g a working chamber, wherein an opening is formed on a wall of the working chamber and allows the cleaner to pass through so that at least part of the cleaner is able to enter the working chamber.

For example, the cleaning device provided by an embodiment of the present disclosure further comprises a baffle plate, wherein the baffle plate is disposed at the opening to open or close the opening.

For example, the cleaning device provided by an embodiment of the present disclosure further comprises at least one external pipe, wherein the external pipe is connected to the cleaner.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 6b is a schematic sectional side view of FIG. 6a;

DETAILED DESCRIPTION

In order to make objects, technical details and advantages of the embodiments of the disclosure apparent, the technical solutions of the embodiments gill be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first" "second," etc., which are used in the description and the claims of the present application for disclosure, are not ended to indicate any sequence, amount or importance, but distinguish various components. Also, the terms such as "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides a cleaner and a cleaning device comprising the same. The cleaner includes; a guide rail; a lifting lever, one end of which is disposed on the guide rail and capable of moving along the guide rail; a feed pipe, disposed inside the lifting lever; and a nozzle, disposed on an end portion of one end of the lifting lever away from the guide rail and communicated with the feed pipe. The lifting lever is configured to allow the nozzle to be away from or close to the guide rail.

The cleaner can clean a cleaning device to be cleaned at different positions and different heights, thus reducing required manpower and improving cleaning efficiency.

Detailed description will be given below to the embodiments of the present disclosure and the examples thereof with reference to the accompanying drawings.

Figure 1A:
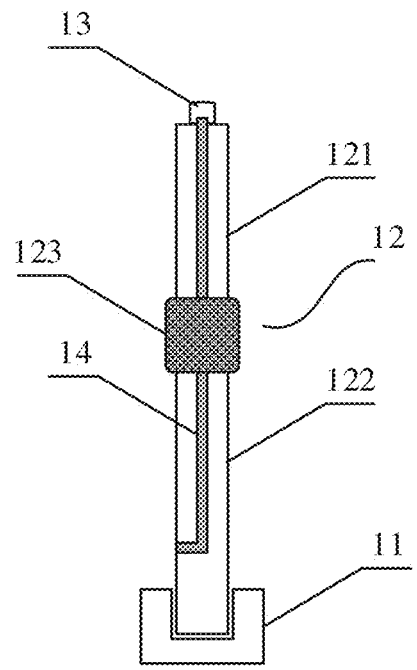
FIG. 1a is a schematic sectional view of a cleaner provided by an embodiment of the present disclosure.

At least one embodiment of the present disclosure provides a cleaner. As illustrated in FIG. 1a, the cleaner includes: a guide rail 11; a lifting lever 12 one end of which is disposed on the guide rail 11 and can move along the guide rail 11; a feed pipe 14 disposed inside the lifting lever 12; and a nozzle 13 disposed on an end portion of one end of the lifting lever 12 away from the guide rail 11 and communicated with the feed pipe 14. The lifting lever 12 is configured to allow the nozzle 13 to be away from or close to the guide rail 11.

For instance, as illustrated in FIG. hi, the guide rail 11 is disposed at the bottom of the cleaner, and one end of the lifting lever 12 is disposed on the guide rail 11 and can move along a rail extension direction of the guide rail 11. It should be noted that the rail extension direction of the guide rail 11 may be set according to the structure of a device to be cleaned, and the guide rail 11 may include various suitable types. The type of the guide rail 11 is not limited in the embodiment of the present disclosure. The following embodiments are the same in this aspect. No further description will be given here.

For instance, as illustrated in FIG. 1a, at least one feed pipe 14 may be disposed inside the lifting lever 12; the nozzle 13 is disposed on the end portion of one end of the lifting lever 12 away from the guide rail 11; and the bottom of the nozzle 13 is communicated with the feed pipe 14. It should be noted that FIG. 1a shows only one feed pipe 14 but the number of the feed pipes 14 is not limited in the embodiment of the present disclosure and, for instance, may also be two, three or more.

In the cleaner provided by the embodiment of the present disclosure, as illustrated in FIG. 1a, the nozzle 13 may be designed to be in a cylindrical shape. Of course, the present disclosure includes but not limited to this design. For instance, the nozzle 13 may also be designed to be in other shapes such as spherical shape. A plurality of openings are formed on the nozzle 13 and not illustrated in the figure. For instance, the plurality of openings may be uniformly distributed on the nozzle 13. For instance, the nozzle 13 may be made from wear-resistant ceramic materials, but the embodiment of the present disclosure is not limited thereto.

In the cleaner provided by the embodiment of the present disclosure, as illustrated in FIG. 1a, the cleaning solution in the nozzle 13 is fed by the feed pipe 14 within the lifting lever 12 and sprayed out via the plurality of openings on the nozzle. The nozzle 13 can be driven to move by the movement of the lifting lever 12 on the guide rail 11. Meanwhile, the lifting lever 12 may also go up and down in an axial direction thereof, so as to clean the device to be cleaned at different positions and different heights.

In one example of the embodiment, as illustrated in FIG. 1a, the lifting lever 12 may include a first lifting lever 121, a second lifting lever 122 and a connecting piece 123 for connecting the first lifting lever 121 and the second lifting lever 122. The nozzle 13 is disposed on an end portion of one end of the first lifting lever 121 away from the guide rail 11. The second lifting lever 122 is disposed on the guide rail 11. The first lifting lever 121 can perform up-and-down movement relative to the second lifting lever 122, namely the lifting lever 12 is configured to allow the nozzle 13 to be away from or close to the guide rail 11.

Figure 1B:
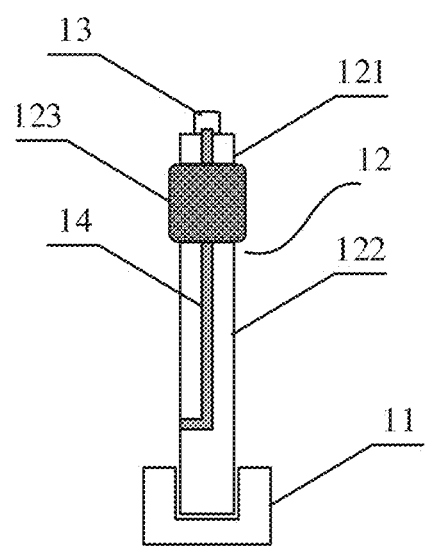
FIG. 1b is a schematic sectional view of the cleaner in FIG. 1a when a first lifting lever goes down.

For instance, as illustrated in FIG. 1a, the first lifting lever 121 can be driven to perform up-and-down movement relative to the second lifting lever 122 by the rotation of the connecting piece 123. For instance, the connecting piece 123 and the first lifting lever 121 form a screw pair. For instance, the connecting piece 123 may be mechanically driven or motor-driven. For instance, when the connecting piece 123 performs clockwise rotation, the first lifting lever is driven to rise relative to the second lifting lever, so that the nozzle 13 can be away from the guide rail 11. For instance, when the connecting piece 123 performs counterclockwise rotation, the first lifting lever is driven to fall relative to the second lifting lever, so that the nozzle 13 can be close to the guide rail 11. FIG. 1b is a schematic diagram illustrating the case that the first lifting lever 121 goes down relative to the second lifting lever 122.

Of course, the case of driving the first lifting lever to perform up-and-down movement relative to the second lifting lever through the rotation of the connecting piece is one example of the present disclosure in which the lifting lever is configured to allow the nozzle to be away from or close to the guide rail. The present disclosure includes but not limited to this case. For instance, the lifting lever may also be set to be telescopic, and the nozzle is driven to be away from or close to the guide rail through the telescoping operation of the lifting lever.

In the embodiment of the present disclosure, the nozzle is driven to move by the movement of the lifting lever on the guide rail, so as to clean the device to be cleaned at different positions. The nozzle is driven to be away from or close to the guide rail through the up-and-down movement of the first lifting lever relative to the second lifting lever, so as to clean the device to be cleaned at different heights.

Figure 2A:
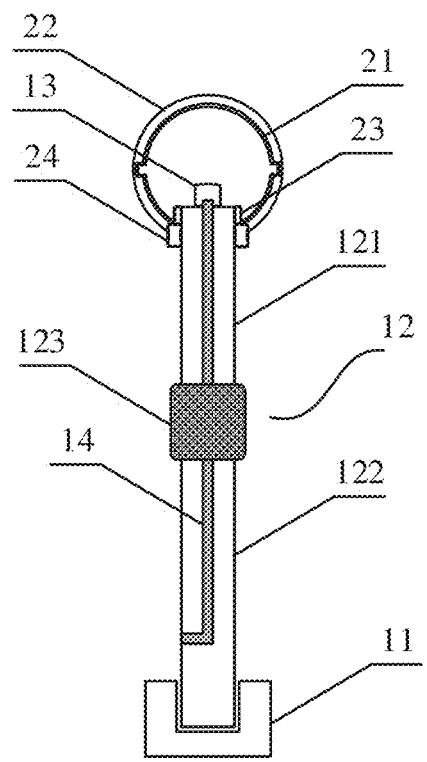
FIG. 2a is a schematic sectional view of a cleaner provided by another embodiment of the present disclosure.

An embodiment of the present disclosure further provides a cleaner. As illustrated in FIG. 2a, the cleaner also comprises: a guide rail 11; a lifting lever 12 one end of which is disposed on the guide rail 11 and can move along the guide rail 11; a feed pipe 14 disposed inside the lifting lever 12; and a nozzle 13 disposed on an end portion of one end of the lifting lever 12 away from the guide rail 11 and communicated with the teed pipe 14. The lifting lever 12 includes a first lifting lever 121, a second lifting lever 122 and a connecting piece 123 for connecting the first lifting lever 121 and the second lifting lever 122. The nozzle 13 is disposed on an end portion of one end of the first lifting lever 121 away from the guide rail 11. The second lifting lever 122 is disposed on the guide rail 11. The first lifting lever 121 can be driven to perform up-and-down movement relative to the second lifting lever 122 by the rotation of the connecting piece 123. The description on the guide rail 11, the lifting lever 12 and the nozzle 13 may refer to corresponding description in the above embodiment, so no further description will be given here.

For instance, as illustrated in FIG. 2a, the cleaner provided by the embodiment further comprises an inner spray head 21 and an outer spray head 22. The inner spray head 21 is disposed inside the outer spray head 22. The nozzle 13 is disposed inside the inner spray head 21. A plurality of first spray holes are formed on the outer spray head 22, and a plurality of second spray heads are formed on the inner spray heads 21. The first spray holes and the second spray holes are not illustrated in the figure. At least one of the inner spray head 21 and the outer spray head is configured to rotate around an axial line of the lifting lever 12.

Figure 2B:
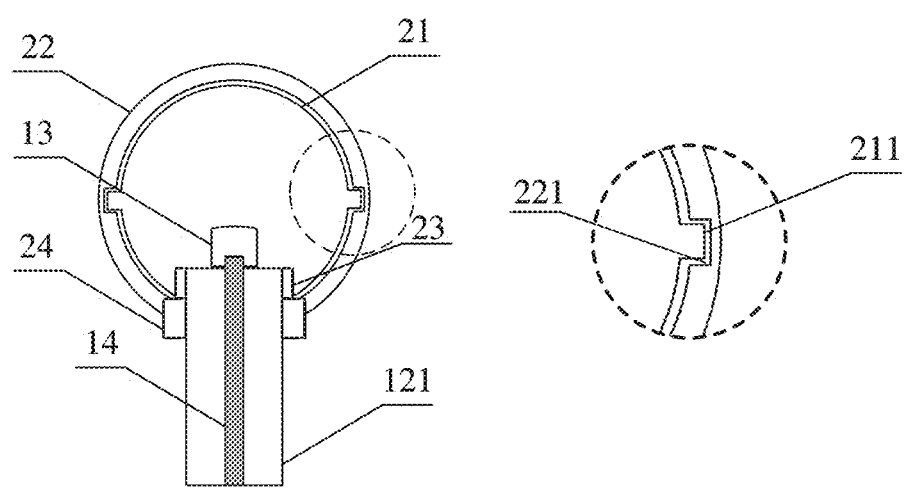
FIG. 2b is a schematic enlarged view of an inner spray head and an outer spray head.

For instance, as illustrated in FIG. 2b which is a schematic enlarged view of the inner spray head 21 and the outer spray head 22 in FIG. 2a, the inner spray head 221 and the outer spray head 22 may be designed to be in a spherical shape. The present disclosure includes but not limited to this case. For instance, the inner spray head 21 and the outer spray head 22 may also be designed to be in other shapes such as an ellipsoidal shape.

For instance, as illustrated in FIG. 2b, the inner spray head 21 and the outer spray head 22 are mounted outside the nozzle 13; the inner spray head 21 covers the outside of the nozzle 13; and the outer spray head 22 covers the outside of the inner spray head 22. That is to say, the inner spray head 21 is disposed inside the outer spray head 22, and the nozzle 13 is disposed inside the inner spray head 21.

For instance, as illustrated in FIGS. 2a and 2b, the inner spray head 21 is connected with the lifting lever 12 through a first rotating joint portion 23 mounted on the top of the lifting lever 12, and the outer spray head 22 is connected with the lifting lever 12 through a second rotating joint portion 24 mounted on the top of the lifting lever 12. For instance, the first rotating joint portion 23 and the second rotating joint portion 24 may be clamped and driven by a motor, compressed gas, etc.

In one example, both the first rotating joint portion 23 and the second rotating joint portion 24 can rotate around the lifting lever 12 and are independent of each other, so the first rotating joint portion 23 and the second rotating joint portion 24 can respectively drive the inner spray head 21 and the outer spray head 22 to rotate around the lifting lever 12. For instance, the rotating speeds of the first rotating joint portion 23 and the second rotating joint portion 24, when rotating around the lifting lever 12, may be respectively controlled by independent driving means, so that the inner spray head 21 and the outer spray head 22 can be respectively driven to rotate around the lifting lever 12 at different rotating speeds. Thus, the relative movement between the inner spray head 21 and the outer spray head 22 can be realized. For instance, the first rotating joint portion 23 may be fixed while the second rotating joint portion 24 may rotate. For instance, the second rotating joint portion 24 may be fixed while the first rotating joint portion 23 may rotate. Moreover, for instance, both the first rotating joint portion 23 and the second rotating joint portion 24 may rotate and have different rotating speeds.

Of course, the case that the inner spray head and the outer spray head are respectively driven to rotate around the lifting lever by the rotation of the first rotating joint portion and the second rotating joint portion is merely one specific example of the present disclosure in which at least one of the inner spray head or the outer spray head is configured to rotate around the lifting lever. The present disclosure includes but not limited to this case.

In the cleaner provided by the embodiment of the present disclosure, for the sake of device maintenance, both the inner spray head and the outer spray head are designed to adopt the mode of being turned on to expose the inside of the inner spray head and the inside of the outer spray head, respectively. For instance, the upper and lower parts of the inner spray head can be unscrewed for the inspection and cleaning of the inside of the inner spray head, and the upper and lower parts of the outer spray head can be unscrewed for the inspection and cleaning of the inside of the outer spray head.

For instance, in one example of the embodiment, as illustrated in FIG. 2b, the inner spray head 21 is provided with a protruded slider 211 which is arranged around an outer surface of the inner spray head 21 and perpendicular to an axial direction of the lifting lever 12; the outer spray head 22 is provided with a recessed guide slot 221 which is arranged around an inner surface of the outer spray head 22 and perpendicular to the axial direction of the lifting lever 12; and the slider 211 is embedded into the guide slot 221 and configured to move relative to the guide slot 221.

For instance, as illustrated, in FIGS. 2a and 2b, when the first rotating joint portion 23 and the second rotating joint portion 24 on the lifting lever 12 rotate around the lifting lever 12 at different rotating speeds, the inner spray head 21 and the outer spray head 22 perform relative movement. At this point, the slider 211 on the outer surface of the inner spray head 21 moves along the guide slot 221 on the inner surface of the outer spray head 22, namely the slider 211 is embedded into the guide slot 221 and configured to move relative to the guide slot 221. The arrangement of the sliders 211 and the guide slots 221 can improve the stability of the inner spray head 21 and the outer spray heads 22 during relative movement, and avoid position deviation during the high-speed relative movement of the inner spray head and the outer spray head.

It should be noted that: in the embodiments of the present disclosure, the inner and outer spray heads refer to the inner spray head 21 and the outer spray head 22. The following embodiments are the same in this aspect. No further description will be given here.

Figure 3A:
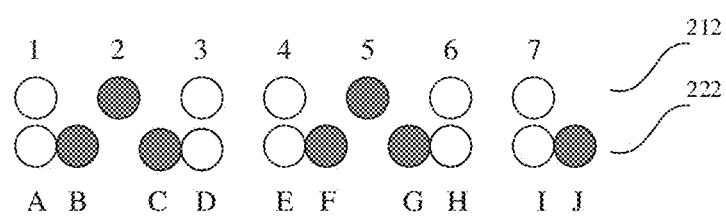
FIG. 3a is a schematic diagram illustrating the relative positions of first spray holes and second spray holes at a first position.
Figure 3B:
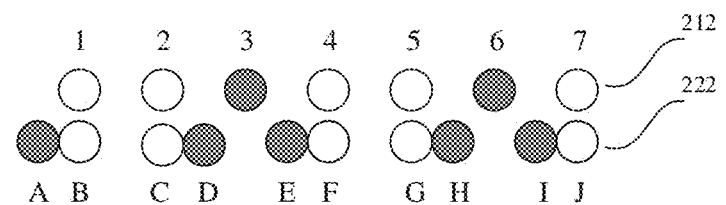
FIG. 3b is a schematic diagram illustrating the relative positions of the first spray holes and the second spray holes at a second position.
Figure 3C:
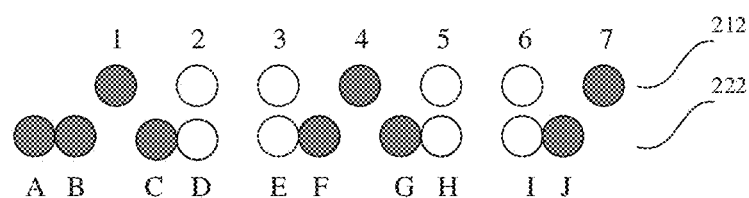
FIG. 3c is a schematic diagram illustrating the relative positions of the first spray holes and the second spray holes at a third position.

For instance, in another example of the embodiment, as illustrated in FIGS. 3a, 3b and 3c, the arrangement pitch of the second spray holes 212 on the inner spray head 21 is different from the arrangement pitch of the first spray holes 222 on the outer spray head 22.

For instance, as illustrated in FIGS. 3a, 3b and 3c, for the sake of description, the spray holes of the inner and outer spray heads at the same height are divided into two rows and expanded on a flat paper for description; the upper row includes the second spray holes 212 of the inner spray head 21, respectively numbered as 1, 2, 3 . . . 7; and the lower row includes the first spray holes 222 of the outer spray head 22, respectively numbered as A, B, C . . . I, J. When the spray holes on the upper and lower rows coincide with each other (namely when the spray holes on the upper and lower rows are illustrated by hollow circles), it indicates that the spray holes of the inner and outer spray heads are coincident, and at this point, the cleaning solution in the inner spray head 21 can be sprayed out of the outer spray head to clean the device to be cleaned. When the spray holes on the upper and lower rows are staggered (namely when the spray holes on the upper and lower rows are illustrated by solid circles), it indicates that the spray holes of the inner and outer spray heads are not coincident, and at this point, the cleaning solution in the inner spray head 21 cannot be sprayed out of the outer spray head and cannot clean the device to be cleaned.

For instance, the arrangement of the first spray holes and the second spray holes may meet the following principles: the arrangement pitches of the first spray holes and the second spray holes are different, and partial staggering is realized in the relative movement process of the inner and outer spray heads. That is to say, when the inner and outer spray heads are at a first position, one part of the first spray holes and the second spray holes are coincident and the other part is staggered, and at this point, the cleaning solution in the inner spray head can be sprayed out from the coincident spray holes. When the inner and outer spray heads arrive at a second position after relative movement, the spray holes previously partially coincident at the first position are staggered and not communicated with each other now, and the spray holes previously staggered at the first position are coincident at this point, so the cleaning solution can be sprayed out from the currently coincident spray holes. The detailed description will be given below.

When the inner and outer spray heads are at the first position as illustrated in FIG. 3a, the spray hole 1 of the inner spray head coincides with the spray hole A of the outer spray head, and at this point, the cleaning solution is sprayed out from the spray hole A of the outer spray head. Due to the same reasons, the spray holes 3 and D, 4 and E, 6 and H, and 7 and I are respectively coincident with each other. At this point, the cleaning solution is respectively sprayed out from the spray holes A, D, E, H and I of the outer spray head, so as to clean the device to be cleaned.

When the inner and outer spray heads perform relative movement, for the sake of description, supposing that the inner spray head is fixed while the outer spray head moves left relative to the inner spray head, when the inner and outer spray heads are at the second position as illustrated in FIG. 3b, the spray holes 1 and B, 2 and C, 4 and F, 5 and G, and 7 and J are respectively coincident, and at this point, the cleaning solution is respectively sprayed out from the spray holes B, C, F, G and J of the outer spray head, so as to clean the device to be cleaned.

When the inner and outer spray heads are at the third position as illustrated in FIG. 3c, the spray holes 2 and D, 3 and E, 5 and H, and 6 and I are respectively coincident, and at this point, the cleaning solution is respectively sprayed out from the spray holes D, E, H and I of the outer spray head, so as to clean the device to be cleaned.

By adoption of the above arrangement mode of the first spray holes and the second spray holes, during the relative movement of the inner and outer spray heads, the cleaning solution can be sprayed out from part of the spray holes of the outer spray head, so as to clean the device to be cleaned. Moreover, the spray holes from which the cleaning solution can be sprayed out are alternately arranged, so as to ensure that the cleaning solution can be sprayed out around the outer spray head.

For instance, the angles of the first spray holes on the outer spray head may be designed to be perpendicular to the outer spray head. By adoption of this mode, the cleaning solution sprayed out from the first spray holes is at plural angles relative to the device to be cleaned, so that the cleaning solution can clean different parts of the device to be cleaned within a large range, and hence the cleaning effect can be improved.

By adoption of the above position arrangement mode of the first spray holes and the second spray holes, during the relative movement of the inner and outer spray heads, the coincident and staggered states of the spray holes on the inner and outer spray heads are constantly changed; when the spray holes of the inner and outer spray heads are coincident, the cleaning solution in the inner spray head can be sprayed out along the coincident spray holes; and when the spray holes of the inner and outer spray heads are staggered, the cleaning; solution in the inner spray head cannot be sprayed out. During rapid relative movement of the inner and outer spray head, the spray holes on the inner and outer spray heads alternate between the coincident state and the staggered states, and at this point, the cleaning solution in the inner spray head can be discontinuously sprayed out to realize the intermittent impact cleaning on the surface of the device to be cleaned. By adoption of the above means, there will be certain impact force when the cleaning solution is sprayed to the surface of the device to be cleaned, so that the effect of cleaning the surface of the device to be cleaned can be improved.

The technical effects of other parts in the embodiment may refer to corresponding description in the above embodiment. No further description will be given here.

Figure 4:
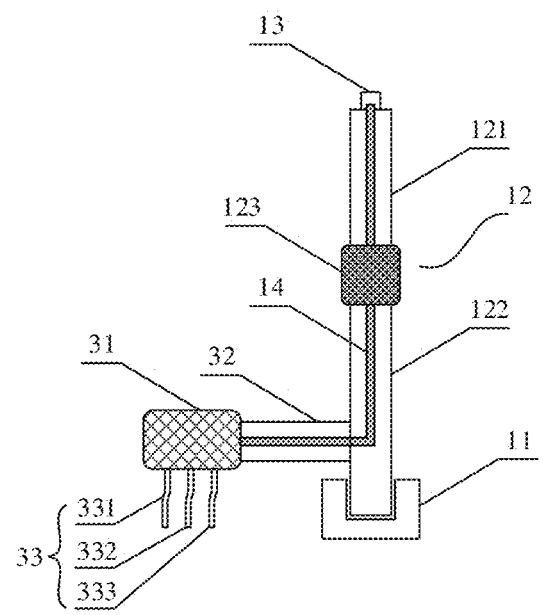
FIG. 4 is a schematic sectional view of a cleaner provided by another embodiment of the present disclosure.

An embodiment of the present disclosure further provides a cleaner. As illustrated in FIG. 4, the cleaner also comprises; a guide rail 11; a lifting lever 12 one end of which is disposed on the guide rail 11 and can move along the guide rail 11; a feed pipe 14 disposed inside the lifting lever 12; and a nozzle 13 disposed on an end portion of one end of the lifting lever 12 away from the guide rail 11 and communicated with the teed pipe 14. The lifting lever 12 includes a first lifting lever 121, a second lifting lever 122 and a connecting piece 123 for connecting the first lifting lever 121 and the second lifting lever 122. The nozzle 13 is disposed on an end portion of one end of the first lifting lever 121 away from the guide rail 11. The second lifting lever 122 is disposed on the guide rail 11. The first lifting lever 121 can be driven to perform up-and-down movement relative to the second lifting lever 122 by the rotation of the connecting piece 123. The description on the guide rail 11, the lifting lever 12 and the nozzle 13 may refer to corresponding description in the above embodiment. No further description will be given here.

For instance, as illustrated in FIG. 4, the cleaner may further comprise a supporting rod 32 connected with one end of the lifting lever 12 close to the guide rail 11 and a multi-way valve, e.g., a multi-way solenoid valve 31, which is connected with one end of the supporting rod 32 away from the lifting lever 12. The supporting rod 32 is, for instance, transversely extended, but not limited to this example. The feed pipe 14 is extended to the supporting rod 32 from the lifting lever 12 and communicated with the multi-way solenoid valve 31. The multi-way valve, e.g., the multi-way solenoid valve 31, may respectively control the on and off operation of a plurality of paths.

For instance, as illustrated in FIG. 4, one end of the multi-way solenoid valve 31 is communicated the teed pipe 14 in the supporting rod 32, and the other end is communicated with external pipes 33; and the external pipes 33 include but not limited to a pure water line 331, a cleaning solution line 332 and a compressed gas line 333. For instance, the number of the external pipes 33 may be set as required and is not limited to three as illustrated in FIG. 4. For instance, the other ends of the three external pipes are respectively communicated with the corresponding pipes at a power source end, not illustrated in the figure.

For instance, when the device to be cleaned needs be cleaned, the multi-way solenoid valve is controlled to be communicated with the cleaning solution line, and the cleaning solution arrives at the nozzle through the feed pipe in the supporting rod and the lifting lever, and is subsequently sprayed out from the spray holes on the inner and outer spray heads, so as to clean the device to be cleaned. After cleaning, the multi-way solenoid valve is controlled to be communicated with the pure water line to further wash the device to be cleaned. When the multi-way solenoid valve is communicated with the cleaning solution line and the pure water line for cleaning the multi-way solenoid valve may be simultaneously communicated with the compressed gas line, so as to clean the device to be cleaned by the mixture of the compressed gas line and the cleaning solution line or the pure water pipe. The gas-liquid mixture fluid formed by this means can achieve a better cleaning effect.

It should be noted that the above cleaning mode is only one example; the embodiment of the present disclosure includes but not limited thereto; and the cleaning modes may be combined as required. For instance, the cleaning operation with cleaning solution and the cleaning operation with pure water may be alternately performed to achieve a better cleaning effect.

For instance, the external pipes adopt high-pressure (more than 0.3 MPa) supply. For instance, an adjustable pressure valve may be disposed between the external pipe(s) and the multi-way solenoid valve to adjust the pressure of liquid or gas supplied by the power end, so a better cleaning effect can be achieved.

In the embodiment of the present disclosure, the cleaner may be required to move along the guide rail in the working process, so the three external pipes, namely the pure water line, the cleaning solution line and the compressed gas line, connected with the multi-way solenoid valve, also move along with the cleaner. For instance, a structure for realizing movement, for instance, the structure such as a tank train, may be provided for the three external pipes, so as to facilitate the movement of the external pipes on one hand, and avoid the bending damage to the external pipes during movement on the other hand.

In the embodiment of the present disclosure, the cleaner selects different cleaning modes to clean the device to be cleaned by control of the multi-way solenoid valve to be communicated with one or simultaneously communicated with a plurality of external pipes at different time periods of the cleaning process. Different cleaning modes share one group of feed pipe and nozzle to clean the device to be cleaned.

The technical effects of other parts in the embodiment may refer to corresponding description in the above embodiment. No further description will be given here.

Figure 5:
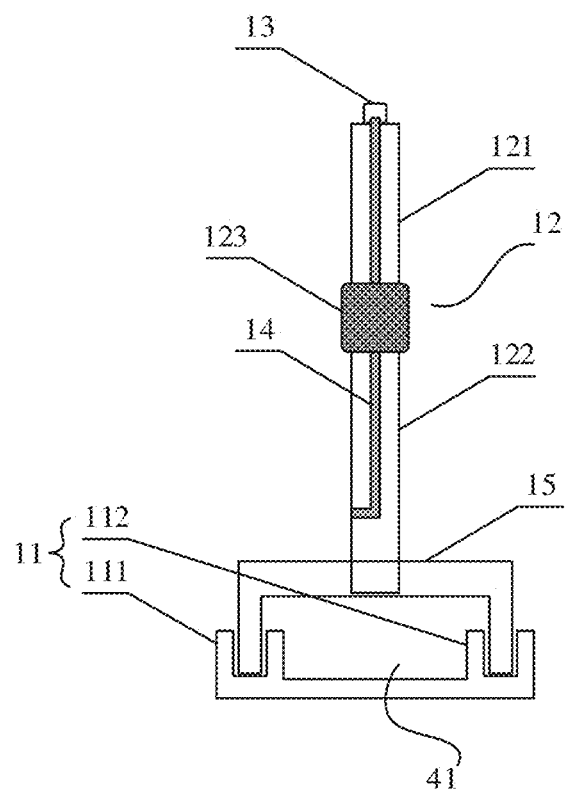
FIG. 5 is a schematic sectional view of a cleaner provided by another embodiment of the present disclosure.

An embodiment of the present disclosure further provides a cleaner. As illustrated in FIG. 5, the cleaner also comprises: a guide rail 11; a lifting lever 12 one end of which is disposed on the guide rail 11 and can move along the guide rail 11; a feed pipe 14 disposed inside the lifting lever 12; and a nozzle 13 disposed on an end portion of one end of the lifting lever 12 away from the guide rail 11 and communicated with the feed pipe 14. The lifting lever 12 includes a first lifting lever 121, a second lifting lever 122 and a connecting piece 123 for connecting the first lifting lever 121 and the second lifting lever 122. The nozzle 13 is disposed on an end portion of one end of the first lifting 121 away from the guide rail 11. The second lifting lever 122 is disposed on the guide rail 11. The first lifting lever 121 can be driven to perform up-and-down movement relative to the second lifting lever 122 by the rotation of the connecting piece 123. The description on the guide rail 11, the lifting lever 12 and the nozzle 13 may refer to corresponding description in the above embodiment. No further description will be given here.

The difference between the cleaner provided by the embodiment and the cleaner provided by the above embodiments is that the cleaner comprises a plurality of parallel sub-rails and a supporting stand which is disposed on the guide rail and can move along the guide rail.

For instance, as illustrated in FIG. 5, the cleaner comprises two parallel sub-rails which are respectively a first sub-rail 111 and a second sub-rail 112. Two ends of the supporting stand 15 are respectively connected with the two sub-rails, and the supporting stand 15 can move along the guide rail 11. The lifting lever 12 is supported on the supporting stand 15. The supporting stand 15 can drive the lifting lever 12 to move along the guide rail 11.

Of course, the two parallel sub-rails described above are one example of the present disclosure in which the guide rail includes the plurality of parallel sub-rails. The present disclosure includes but not limited to this case.

In the embodiment, two sub-rails are arranged in parallel, and a supporting stand is spanned on the two sub-rails and can move along the guide rail. The lifting lever is supported on the supporting stand and can be driven by the supporting stand to move along the guide rail. The above configuration can improve the stability of the cleaner during movement and avoid position deviation when the cleaner cleans the device to be cleaned.

For instance, in one example of the embodiment, as illustrated in FIG. 5, the cleaner further comprises a liquid guiding groove 41 disposed between the first sub-rail 111 and the second sub-rail 112. For instance, the liquid guiding groove 41 is set to be inclined. For instance, the inclination angle is set to be 5°. Moreover, for instance, the inclination angle is set to be 10°. Furthermore, for instance, the inclination angle is set to be any angle between 5° and 10°. A drainage pipe is disposed at a lower end of the liquid guiding groove 41, not illustrated in the figure.

In the embodiment of the present disclosure, an inclined liquid guiding groove is disposed between the sub-rails, and liquid such as the cleaning solution dripped into the liquid guiding groove can be discharged from the drainage pipe in time, so as to avoid the pollution when the cleaning solution is dripped into the lower part of the cleaner.

The technical effects of other parts in the embodiment may refer to corresponding description in the above embodiment. No further description will be given here.

Figure 6A:
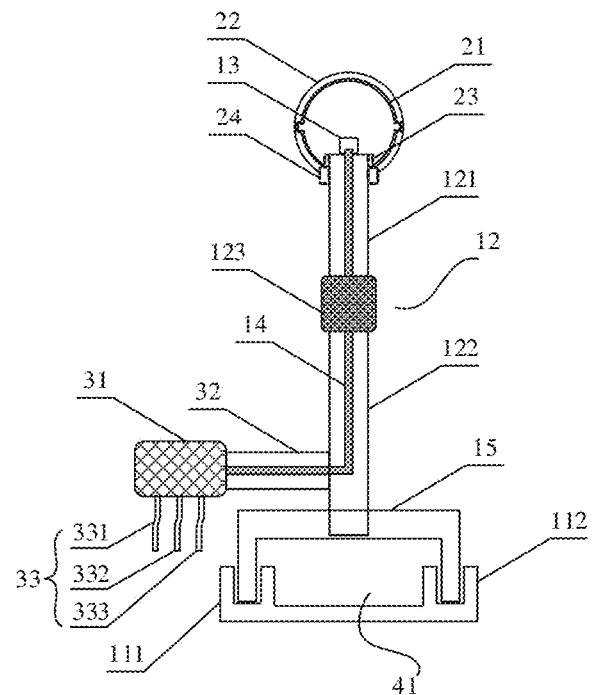
FIG. 6a is a schematic sectional view of a cleaner provided by another embodiment of the present disclosure.

An embodiment of the present disclosure further provides a cleaner. As illustrated in FIG. 6a, the cleaner comprises two parallel sub-rails which are respectively a first sub-rail 111 and a second sub-rail 112. Two ends of a supporting stand 15 are respectively connected with the two sub-rails, and the supporting stand 15 can move along the guide rail. A lifting lever 12 is supported on the supporting stand 15. The supporting stand 15 can drive the lifting lever 12 to move along the guide rail.

As illustrated in FIG. 6a, the cleaner comprises a feed pipe 14 disposed inside the lifting lever 12, and a nozzle 13 disposed on an end portion of one end of the lifting lever 12 away from the guide rail 11 and communicated with a feed pipe 14. The lifting lever 12 includes a first lifting lever 121, a second lifting lever 122 and a connecting piece 123 for connecting the first lifting lever 121 and the second lifting lever 122. The nozzle 13 is disposed on an end portion of one end of the first lifting lever 121 away from the guide rail 11. The second lifting lever 122 is disposed on the rail 11. The first lifting lever 121 can be driven to perform up-and-down movement relative to the second lifting lever 122 by the rotation of the connecting piece 123.

As illustrated in FIG. 6a, the cleaner further comprises an inner spray head 21 and an outer spray head 22, the inner spray head 21 is disposed inside the outer spray head 22, and the nozzle 13 is disposed inside the inner spray head 21. A plurality of first spray holes 222 are formed on the outer spray head 22, and a plurality of second spray holes 212 are formed on the inner spray head 21. At least one of the inner spray head 21 and the outer spray head 22 is configured to rotate around the lifting lever 12. The arrangement pitch of the second spray holes 212 on the inner spray head 21 is different from the arrangement pitch of the first spray holes 222 on the outer spray head 22.

The inner spray head 21 is provided with protruded sliders 211 which are arranged around an outer surface of the inner spray head 21 and perpendicular to an axial direction of the lifting lever 12, and the outer spray head 22 is provided with a recessed guide slot or slots 221 which are arranged around an inner surface of the outer spray head 22 and perpendicular to the axial direction of the lifting lever 12, and the sliders 211 are embedded into the guide slots) 221 and move relative to the guide slot 221.

As illustrated in FIG. 6a, the cleaner further comprises a supporting rod 32 connected with one end of the lifting lever 12 close to the guide rail 11, and a multi-way solenoid valve 31 connected with one end of the supporting rod 32 away from the lifting lever 12. The feed pipe 14 is extended to the inside of supporting rod from the lifting lever and communicated with the multi-way solenoid valve 31.

One end of the multi-way solenoid valve 31 is communicated with the feed pipe 14 in the supporting rod 32, and the other end is communicated with external pipes 33. The external pipes 33 include but not limited to a pure water line 331, a cleaning solution line 332 and a compressed gas line 333.

Figure 6B:
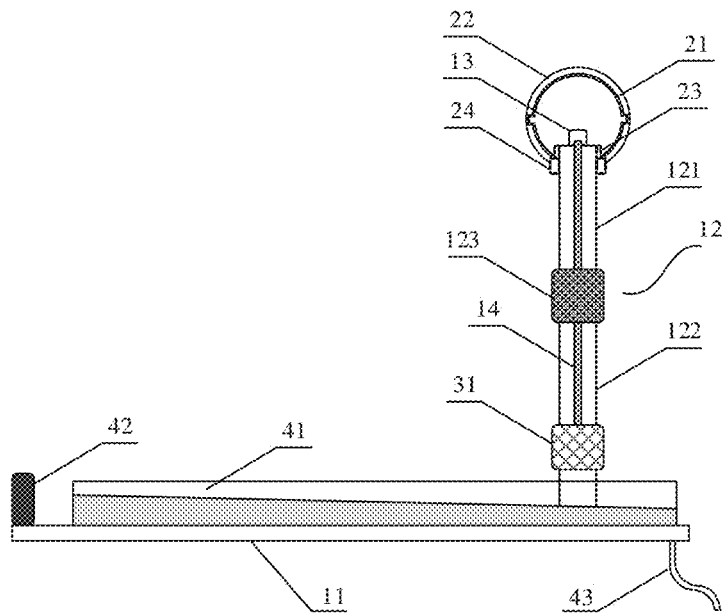

FIG. 6b is a schematic side view of FIG. 6a. For instance, as illustrated in FIGS. 6a and 6b, the cleaner further comprises a liquid guiding groove 41 disposed between the first sub-rail 111 and the second sub-rail 112. The liquid guiding groove 41 is set to be inclined. For instance, the inclination angle is set to be 5°. For instance, the inclination angle, is set to be 10°. Moreover, for instance, the inclination angle is set to be any angle between 5° and 10°. A drainage pipe 43 is disposed at a lower end of the liquid guiding groove 41.

An inclined liquid guiding groove is disposed between the sub-rails, and the cleaning solution dripped into the liquid guiding groove can be discharged from the drainage pipe in time, so as to avoid the pollution when the cleaning solution is dripped into the lower part of the cleaner.

For instance, in one example of the embodiment, as illustrated in FIG. 6b, the cleaner may further comprise a range unit disposed on the guide rail 11, e.g., a laser ranging unit 42. The laser ranging unit 42 may be disposed at any end of the first sub-rail or the second sub-rail, for instance, disposed at one end of the first sub-rail, and moreover, for instance, disposed at one end of the second sub-rail. The movement distance of the cleaner along the guide rail can be accurately controlled by the laser ranging unit 42 disposed on the guide rail, so as to realize accurate positioning of the cleaner.

Detailed description will be given below to the working process of the cleaner with reference to FIGS. 6a and 6b:

firstly, the supporting stand 15 is controlled to drive the inner and outer spray heads on the lifting lever 12 to move to a predetermined position along the guide rail 11, and the rotation of the connecting piece 123 is controlled so that the inner and outer spray head can be lifted up or dropped down to a specified height.

Secondly, the multi-way solenoid valve 31 is controlled to be communicated with one external pipe 33 or simultaneously communicated with a plurality of external pipes 33, and allowing liquid, gas or gas-liquid mixture fluid in the communicated external pipes 33 to arrive at the inner spray head 21 through the feed pipe 14 and the nozzle 13; and Finally, the intermittent spraying of the liquid, the gas or the gas-liquid mixture fluid in the inner spray head 21 is realized through the relative movement of the inner spray head 21 and the outer spray head 22 and the position arrangement of the spray holes on the inner and outer spray heads, so as to conduct the intermittent cleaning of a surface of a device to be cleaned.

In the cleaning process, the position and the height of the inner and outer spray heads may be randomly adjusted to realize the cleaning of the device to be cleaned at different positions. During cleaning, the multi-way solenoid valve 31 may be randomly controlled to select the external pipes 33 that are communicable, namely selecting different cleaning modes to clean the device to be cleaned.

Figure 6C:
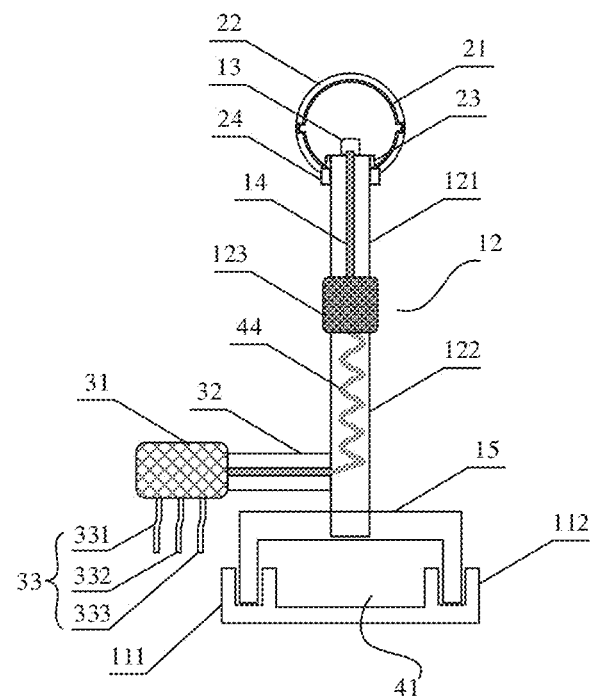
FIG. 6c is a schematic sectional view of a cleaner provided by another embodiment of the present disclosure.

For instance, in another example of the embodiment, as illustrated in FIG. 6c, the feed pipe 14 includes a hose 44 designed to be in a spiral shape, and the hose 44 is disposed in the second lifting lever 122. When the first lifting lever 121 needs go up or down, the connecting piece 123 rotates to drive the first lifting lever 121 to rise or fall relative to the second lifting lever 122. At this point, the hose 44 disposed in the second lifting lever 122 is spirally extended or shrunk along with the rotation of the connecting piece 123. By adoption of this means, the feed pipe 14 also rises or falls along with the first lifting lever when the first lifting lever 121 goes up or down, and meanwhile, the spiral up-and-down movement can avoid the bending of the feed pipe 14 and extend the service life of the feed pipe 14.

Of course, the setting position of the hose 44 in the feed pipe 14 is not limited to the above case. For instance, the hose 44 may also be disposed in the first lifting lever 121. Moreover, for instance, the hose 44 may also be disposed in the first lifting lever 121 and the second lifting lever 122.

Other technical effects of the cleaner provided by the embodiment may refer to the technical effects of the cleaner described in the above embodiment. No further description will be given here.

It should be noted that the embodiments of the cleaner provided by the present disclosure and the characteristics in the embodiments may be mutually combined to obtain new embodiments of the cleaner without conflict. No limitation will be given here in the present disclosure.

An embodiment of the present disclosure further provides a cleaning device, which comprises the cleaner provided by any foregoing embodiment.

Figure 7A:
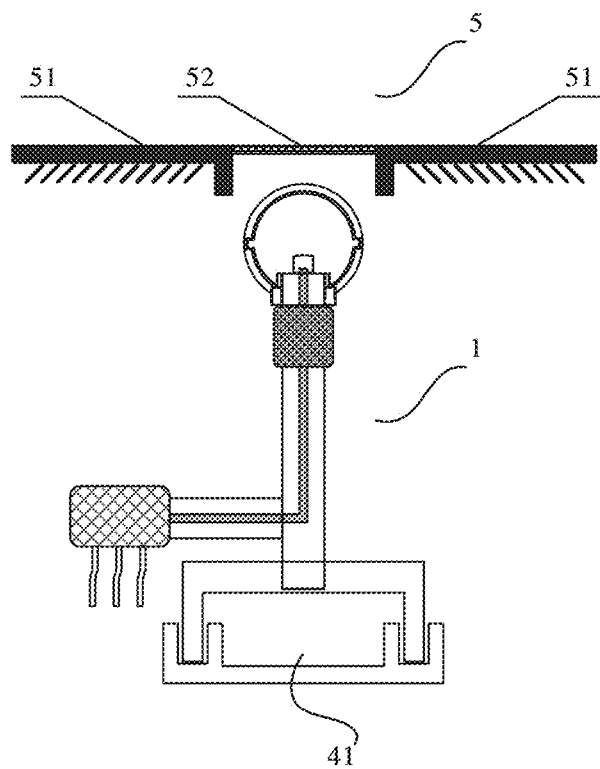
FIG. 7a is a schematic diagram of leaning device provided by an embodiment of the present disclosure in an off working state.
Figure 7B:
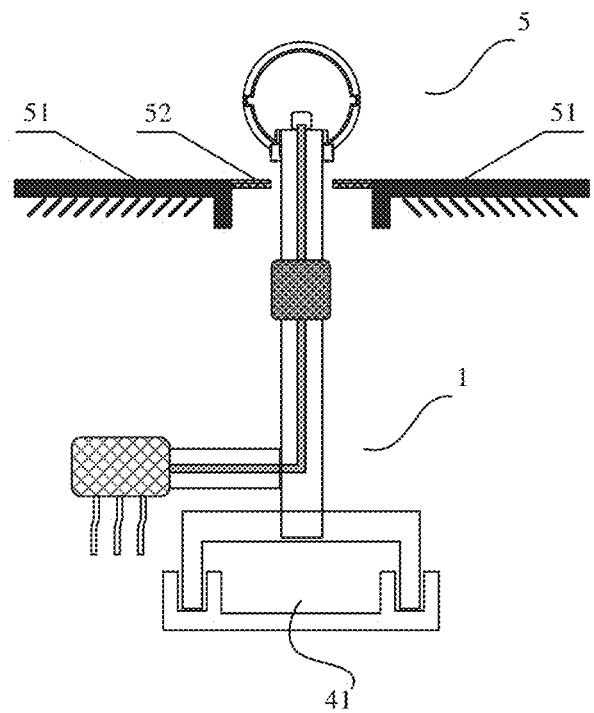
FIG. 7b is a schematic diagram of the cleaning device provided by an embodiment of the present disclosure in a working state.

For instance, as illustrated in FIGS. 7a and 7b, the cleaning device further comprises a working chamber, e.g., a developing chamber 5. An opening is formed on a bottom plate 51 of the developing chamber and can allow the cleaner 1 to pass through so that at least part of the cleaner can enter the developing chamber 5. A baffle plate 52 is disposed at the opening to open or close the opening.

It should be noted that the developing chamber is one example of the working chamber in the present disclosure. The present disclosure includes but not limited thereto.

As illustrated in FIGS. 7a and 7b, when the cleaner 1 cleans the developing chamber 5, part of the cleaning solution may be dripped to the lower part of the bottom plate 51 of the developing chamber along the lifting lever. In order to prevent this situation, the baffle plates 52 are designed on the bottom plate 51 of the developing chamber. When the cleaner 1 rises from the lower part of the bottom plate 51 of the developing chamber, the baffle plates 52 are opened, and the opening gap is enough for the outer spray head to pass through; and subsequently, the baffle plates 52 are close to each other to reduce the opening gap of the bottom plate of the developing chamber and maintain e possibility of free rising or falling of the lifting lever. By adoption of this means, the amount of the cleaning solution, dripped to the lower part of the bottom plate 51 of the developing chamber in the clean process, can be reduced. Meanwhile, in order to avoid part of the cleaning solution from being dripped to the lower part of the cleaning device, a liquid guiding groove 41 is disposed between sub-rails of the cleaner 1, and the width of the liquid, guiding groove 41 is greater than the opening width between the baffle plates 52 so as to ensure that the cleaning solution dripped from the opening gap of the baffle plates 52 can be dripped into the liquid guiding groove 41. Other description on the liquid guiding groove 41 may refer to corresponding description in the above embodiment. No further description will be given here.

For instance, the cleaning device further comprises at least one external pipe 33. The external pipe 33 is connected to the cleaner 1, for instance, communicated with the feed pipe in the cleaner 1 through a multi-way valve. As described above, external pipes 33 include but not limited to a pure water line 331, a cleaning solution line 332 and a compressed gas line 333. For instance, the number of the external pipes 33 may be set as required, but not limited thereto. For instance, the other ends of the above three external pipes are respectively communicated with corresponding pipes at a power source end, not illustrated in the figure.

Detailed description will be given below to the working process of the cleaning device with reference to FIGS. 7a and 7b:

When cleaning is required, the baffle plates 52 are opened, and the lifting lever of the cleaner 1 goes up and drives the inner and outer spray heads to be lifted up to be above the bottom plate 51 of the developing chamber, namely the inside of the developing chamber 5, so as to clean the device to be cleaned inside the developing chamber 5. After cleaning, the lifting lever of the cleaner 1 goes down and drives the inner and outer spray heads to be dropped down to the lower part of the bottom plate 51 of the developing chamber; subsequently, the baffle plates 52 are closed; and the cleaner 1 and the developing chamber 5 are separate and independent of each other, not affecting the normal operation of the developing chamber 5. The specific working process of the cleaner 1 may refer to corresponding description in the above embodiment. No further description will be given here.

Figure 8:
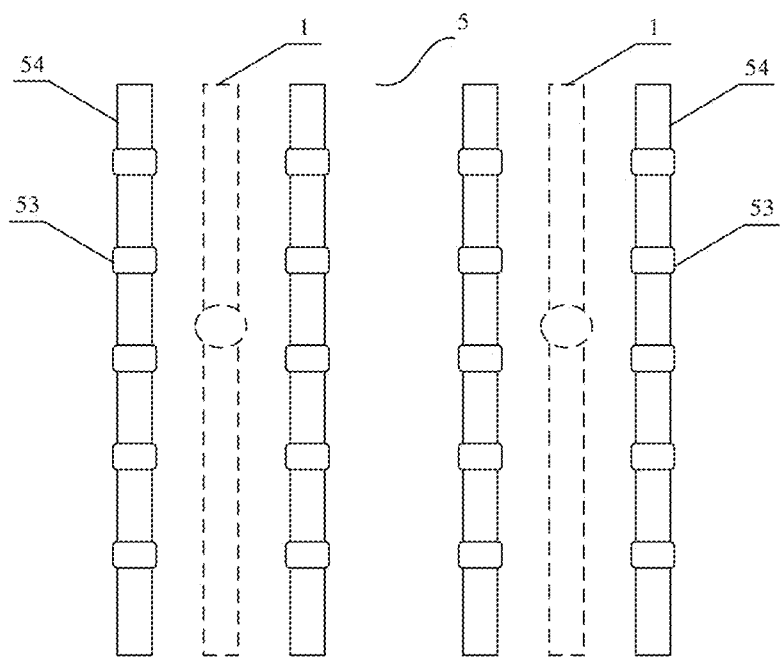
FIG. 8 is a schematic diagram of the cleaners provided by an embodiment of the present disclosure in a developing chamber.

For instance, as illustrated in FIG. 8, the developing chamber 5 may also be provided with roller wheels 53 and roller support bars 54. Four rows of roller wheels are illustrated in the figure, and the cleaner 1 is disposed between every two rows of roller wheels of the developing chamber 5. The number of the cleaners 1 may be set according to the space of the developing chamber 5 and the cleaning distance of the cleaner 1, so as to ensure that the entire developing chamber 5 can be cleaned.

In the embodiment of the present disclosure, the cleaning device may further comprise a control system. The control system may control the operation of all the components of the cleaning device, for instance, controlling the movement of the cleaner and the rotation angle of the connecting piece, for instance, controlling the multi-way solenoid valve to realize the communication of one or more external pipes, for instance, controlling the rotating speed of the inner and outer spray heads relative to the lifting lever, and moreover, for instance, controlling the opening or closing of the baffle plates. All the above control operations may be realized by operating buttons designed on an operation panel, so the control convenience of the cleaning device can be improved.

For instance, the rising or falling height of the lifting lever is controlled by the control system. The relationship between the rotation angle of the connecting piece and the rising or falling height of the lifting lever may be predesigned through a computer program. When the lifting lever is required to go up or down, the user only needs to input the specific height required to be lifted up or dropped down at a predetermined position of the operation panel, and the control system can automatically convert this value into the specific angle of the clockwise or counterclockwise rotation of the connecting piece, and then control the rotation of the connecting piece, and finally realize the rising or falling of the lifting lever to specified height.

The control system, for instance, may include a processor and a storage medium. Computer-executable programs are stored in the storage medium. When the computer-executable programs are executed by the processor, corresponding input and output devices can be controlled to realize data acquisition, component operation, data output, etc.

It should be noted that for the sake of clarity, not all the structures of the cleaning device are given in the present disclosure. In order to realize necessary functions of the cleaning device, other structures not illustrated quay be arranged by those skilled in the art according to specific application scene. No limitation will be given here in the present disclosure.

At least one embodiment of the present disclosure provides a cleaner and a cleaning device comprising the same. The cleaner and the cleaning device comprising the same can realize at least one of the following advantages:

(1) The cleaner provided by at least one embodiment of the present disclosure can clean the device to be cleaned at different positions and different heights.

(2) The cleaner provided by at least one embodiment of the present disclosure can realize the intermittent cleaning of the device to be cleaned, so that the cleaning solution sprayed to the surface of the device to be cleaned can have a certain impact force, and hence the cleaning effect can be improved.

(3) The cleaner provided, by at least one embodiment of the present disclosure can adopt different cleaning modes at different time periods of the cleaning process, and share one group of feed pipe and nozzle to clean the device to be cleaned.

(4) The cleaner provided by at least one embodiment of the present disclosure can realize accurate control of the cleaning position and the cleaning height.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in an embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A cleaner, comprising:
a guide rail;
a lifting lever, one end of which is disposed on the guide rail and capable of moving along the guide rail;
a feed pipe, disposed inside the lifting lever; and
a nozzle, disposed on an end portion of one end of the lifting lever away from the guide rail and communicated with the feed pipe, wherein the lifting lever is configured to allow the nozzle to be away from or close to the guide rail, to increase or decrease a distance between the nozzle and the guide rail,
the lifting lever includes a first lifting lever, a second lifting lever, and a connecting piece connecting the first lifting lever and the second lifting lever,
the nozzle is disposed on an end portion of the first lifting lever, the second lifting lever is disposed on the guide rail, and the first lifting lever can perform an up-and-down movement relative to the second lifting lever.

2. The cleaner according to claim 1, wherein the connecting piece is configured to rotate to drive the first lifting lever to perform the up-and-down movement relative to the second lifting lever.

3. The cleaner according to claim 1, further comprising:
an inner spray head and an outer spray head,
wherein the inner spray head is disposed inside the outer spray head, the nozzle is disposed inside the inner spray head, a plurality of first spray holes are provided on the outer spray head, a plurality of second spray holes are provided on the inner spray head, and at least one of the inner spray head or the outer spray head is configured to rotate around the lifting lever.

4. The cleaner according to claim 3, wherein the inner spray head is provided with a protruded slider which is arranged around an outer surface of the inner spray head and perpendicular to an axial direction of the lifting lever,
the outer spray head is provided with a recessed guide slot which is arranged around an inner surface of the outer spray head and perpendicular to the axial direction of the lifting lever, and
the protruded slider is embedded into the recessed guide slot and configured to move relative to the recessed guide slot.

5. The cleaner according to claim 1, further comprising a multi-way valve disposed at one end of the lifting lever close to the guide rail,
wherein the multi-way valve is close to one end of the lifting lever close to the guide rail and communicated with the feed pipe.

6. A cleaning, comprising:
a guide rail;
a lifting lever, one end of which is disposed on the guide rail and capable of moving along the guide rail;
a feed pipe, disposed inside the lifting lever; and
a nozzle, disposed on an end portion of one end of the lifting lever away from the guide rail and communicated with the feed pipe, wherein the lifting lever is configured to allow the nozzle to be away from or close to the guide rail, to increase or decrease a distance between the nozzle and the guide rail, wherein the cleaner further comprises:

an inner spray head and an outer spray head, wherein the inner spray head is disposed inside the outer spray head, the nozzle is disposed inside the inner spray head, a plurality of first spray holes are provided on the outer spray head, a plurality of second spray holes are provided on the inner spray head, and at least one of the inner spray head or the outer spray head is configured to rotate around the lifting lever.

7. The cleaner according to claim 6, wherein an arrangement pitch of the second spray holes on the inner spray head is different from an arrangement pitch of the first spray holes on the outer spray head.

8. The cleaner according to claim 5, further comprising a supporting rod connected with the one end of the lifting lever close to the guide rail, wherein the multi-way valve is connected with one end of the supporting rod away from the lifting lever.

9. The cleaner according to claim 6, wherein the inner spray head is provided with a protruded slider which is arranged around an outer surface of the inner spray head and perpendicular to an axial direction of the lifting lever, the outer spray head is provided with a recessed guide slot which is arranged around an inner surface of the outer spray head and perpendicular to the axial direction of the lifting lever, and the protruded slider is embedded into the recessed guide slot and configured to move relative to the recessed guide slot.

10. The cleaner according to claim 1, further comprising a multi-way valve disposed at one end of the lifting lever close to the guide rail, wherein the multi-way valve is close to the one end of the lifting lever close to the guide rail and communicated with the feed pipe.

11. The cleaner according to claim 10, further comprising a supporting rod connected with the one end of the lifting lever close to the guide rail, wherein the multi-way valve is connected with one end of the supporting rod away from the lifting lever.

12. A cleaner, comprising:

a guide rail;

a lifting lever, one end of which is disposed on the guide rail and capable of moving along the guide rail;

a feed pipe, disposed inside the lifting lever; and a nozzle, disposed on an end portion of one end of the lifting lever away from the guide rail and communicated with the feed pipe, wherein the lifting lever is configured to allow the nozzle to be away from or close to the guide rail, to increase or decrease a distance between the nozzle and the guide rail, wherein the cleaner further comprises a laser ranging unit disposed on the guide rail.

13. The cleaner according to claim 1, further comprising a supporting stand which is disposed on the guide rail and capable of moving along the guide rail, wherein the guide rail includes a plurality of parallel sub-rails, and the lifting lever is supported on the supporting stand.

14. The cleaner according to claim 13, further comprising a liquid guiding groove disposed between the parallel sub-rails, wherein the liquid guiding groove is set to be inclined.

15. A cleaning device, comprising the cleaner according to claim 1.

16. The cleaning device according to claim 15, further comprising a working chamber, wherein an opening is formed on a wall of the working chamber and allows the cleaner to pass through so that at least part of the cleaner is able to enter the working chamber.

17. The cleaning device according to claim 13, further comprising a baffle plate, wherein the baffle plate is disposed at the opening to open or close the opening.

18. The cleaning device according to claim 15, further comprising at least one external pipe, wherein the external pipe is connected to the cleaner.

19. The cleaner according to claim 3, wherein an arrangement pitch of the second spray holes on the inner spray head is different from an arrangement pitch of the first spray holes on the outer spray head.

* * * * *